(12) United States Patent
Cai

(10) Patent No.: US 9,348,215 B2
(45) Date of Patent: May 24, 2016

(54) PHOTOLITHOGRAPHIC MASKS AND FABRICATION METHOD THEREOF

(71) Applicant: Semiconductor Manufacturing International (Shanghai) Corporation, Shanghai (CN)

(72) Inventor: Boxiu Cai, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 190 days.

(21) Appl. No.: 14/140,678

(22) Filed: Dec. 26, 2013

(65) Prior Publication Data

US 2015/0037714 A1 Feb. 5, 2015

(30) Foreign Application Priority Data

Jul. 24, 2013 (CN) .......................... 2013 1 0315233

(51) Int. Cl.
*G03F 1/38* (2012.01)

(52) U.S. Cl.
CPC ........................................ *G03F 1/38* (2013.01)

(58) Field of Classification Search
CPC .......................................................... G03F 1/38
USPC ............................................................... 430/5
See application file for complete search history.

(56) References Cited

U.S. PATENT DOCUMENTS

2005/0084767 A1* 4/2005 Zait ........................... G03F 1/72
430/5
2014/0016660 A1* 1/2014 Lunev ...................... H01L 33/38
372/46.01

* cited by examiner

*Primary Examiner* — Stephen Rosasco
(74) *Attorney, Agent, or Firm* — Anova Law Group, PLLC

(57) ABSTRACT

A photolithographic mask is provided. The photolithographic mask includes a substrate having a first surface configured as a light incidence plane of an exposure light and a second surface. The photolithographic mask also includes a plurality of scattering centers functioning as a refractive index disturbance inside the substrate. Further, the photolithographic mask includes a plurality of mask patterns on the second surface of the substrate.

20 Claims, 3 Drawing Sheets

PHOTOLITHOGRAPHIC MASKS AND FABRICATION METHOD THEREOF

CROSS-REFERENCES TO RELATED APPLICATIONS

This application claims the priority of Chinese patent application No. 201310315233.6, filed on Jul. 24, 2013, the entirety of which is incorporated herein by reference.

FIELD OF THE INVENTION

The present invention generally relates to the field of semiconductor manufacturing technology and, more particularly, relates to photolithographic masks and fabrication techniques thereof.

BACKGROUND

Photolithography is a major process in the manufacturing of integrated circuits (ICs). A major task of a photolithography process is to transfer patterns on a mask to a photoresist layer on a wafer. The projection light propagates through the patterns on the mask, and arrives at the wafer. The patterns on the mask are equivalent to obstacles in the propagation path of the projection light, thus the patterns on mask may be obtained on the wafer. According to the principle of light diffraction and the principle of light interference, a light diffraction may happen when the projection light propagate through the mask; and a light interference may happen between the projection light at different position of the mask. Thus, the light intensity distribution of the actual projection light projecting on the wafer is a result of a superposition of diffracted light; and the patterns on the wafer may be unable to be exactly identical to the patterns on the mask.

According to the principle of light diffraction and the principle of light interference, when a size of the obstacles is far greater than a wavelength of the projection light, an error of the patterns caused by the light diffraction may be omitted. That is, when a size of the patterns (critical dimension of ICs) on the mask is far greater than a wavelength of the projection light, the patterns on the mask may be identical to the patterns on the wafer. However, for an ultra-submicron fabrication process, the critical dimension of the ICs may be bellow 0.13 μm, or even bellow 0.09 μm.

Thus, the critical dimension of the ICs may be near to, or smaller than the wavelength of the projection light, thus the light diffraction may become more prominent, and a size deviation between the patterns on the mask and the patterns on the wafer may no longer be omitted. With the continuously shrinking of the critical dimension of the ICs, deformations and deviations of the patterns formed by a photolithography process have become more and more severe, and have become a major issue affecting performance and yield of the ICs.

At positions where adjacent patterns are proximity to each other, the light diffraction and interference may become more obvious, and the pattern deviations may be relatively large. For example, the pattern deviations at the ends of lines or corners of patterns may be relatively obvious. Another example is an array of regular patterns (such as through holes, etc). When the projection light propagates through a pattern array on the mask, a light intensity along a lateral direction and a light intensity along a diagonal direction may not be symmetric, thus the corresponding pattern array formed on the photoresist layer may be deformed.

In the manufacturing of ICs, certain patterns may be key components affecting electrical properties and functions of circuits. Thus, if these patterns are deformed, the performance of the whole IC chip may be affected, and even cause the circuits to fail. The deviation between the patterns on the mask and the obtained patterns after the photolithography process caused by the light diffraction and/or light interference may be referred as an optical proximity effect (OPE). In a photolithography process, the OPE may be unavoidable. Thus, certain methods and techniques may have to be used to reduce the deformation and the deviation between the patterns on the mask layer and the corresponding patterns on the wafer as much as possible, so that the performance and yield of the IC chips may be guaranteed.

A yield-driven mask correction method may be implanted between the physical design of a mask and the fabrication of mask to reduce the OPE. For the yield-driven mask correction method, the deformation and deviation of the patterns during a photolithography process may be compensated by alternating shapes and/or densities of the patterns on the mask, and/or phases of the projection light propagating through the mask. Expected patterns may be obtained on the wafer using the yield-driven mask correction method. The yield-driven mask correction method may include a reticle enhancement technology. The reticle enhancement technology may include an optical proximity correction (OPC) and a phase shift mask. Among of these technologies, the OPC may be an effective reticle enhancement technology.

A correction method using assisting patterns, as a relatively mature OPC method, has been widely used. The correction method using assisting patterns include laying out main patterns (mask patterns) on the mask; followed by adding assisting patterns around the main patterns. When performing an exposure process, the main patterns are resolved from a photoresist layer on a wafer, while the assisting patterns are not resolved from the photoresist layer. When the assisting patterns are added, loose layout patterns and dense layout patterns may have a same layout environment, and it causes an exposure light propagating through the patterns on the mask to have same density distributions in different directions. Thus, it not only increases the process window of a photolithography process, but also increases a contrast of the patterns.

In row-column distributed patterns, assisting patterns are also often added to increase the contrast. FIG. 1 illustrates a corresponding layout.

As shown in FIG. 1, row-column distributed main patterns 101 are formed on a mask; and an assisting pattern 102 is added at a cross point of two diagonals of four main patterns 101. By adding the assisting pattern 102, after an exposure light propagates through the patterns on the mask, an asymmetry between a lateral light intensity $I_x$ and a diagonal light intensity $I_c$ is reduced, thus a deviation between the patterns in a photoresist layer and the expected patterns is reduced. That is, if there is no the assisting pattern 102, when the exposure light irradiates the main patterns 101, because the distance between two lateral main patterns 101 is not equal to the distance between two main patterns 101 along the diagonal direction, or the distance between two lateral main patterns 101 is significantly different from the distance between two main patterns 101 along the diagonal direction, the light diffraction and the light interference of the exposure light along the lateral direction and the diagonal direction are different. Thus, the intensities of the exposure light propagating through the main patterns along the lateral direction and along the diagonal direction are asymmetric, or significantly different; and the obtained patterns in the photoresist may be significantly different from the expected patterns.

With the continuously shrinking of the critical dimension of patterns, spaces between the patterns has become smaller and smaller. It may bring new challenges to the layout of the assisting patterns, and the process window of a photolithography process. For example, it may be difficult to add assisting patterns between adjacent patterns. The disclosed device structures and methods are directed to solve one or more problems set forth above and other problems.

BRIEF SUMMARY OF THE DISCLOSURE

One aspect of the present disclosure includes a photolithographic mask. The photolithographic mask includes a substrate having a first surface configured as a light incidence plane and a second surface. The photolithographic mask also includes a plurality of scattering centers functioning as a refractive index disturbance inside the substrate. Further, the photolithographic mask includes a plurality of mask patterns on the second surface of the substrate.

Another aspect of the present disclosure includes a method for fabricating a photolithographic mask. The method includes providing substrate having a first surface configured as a light incidence plane and a second face. The method also includes forming a plurality of scattering centers functioning as a refractive index disturbance inside the substrate. Further, the method includes forming a plurality of mask patterns on the second surface of the substrate.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
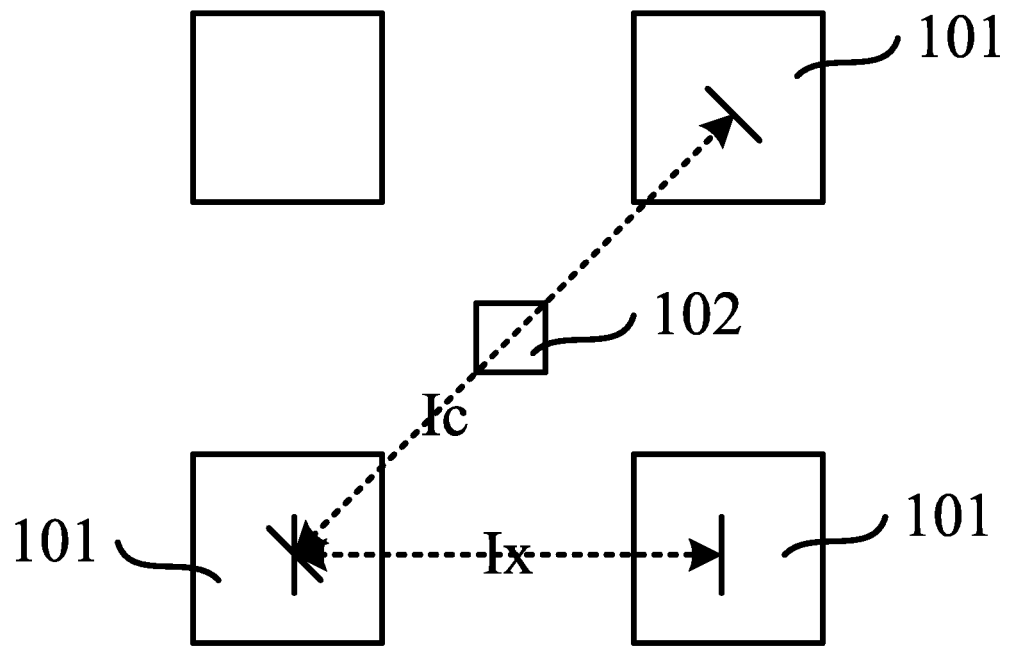
FIG. 1 illustrates a layout of existing main patterns and assisting patterns on a photolithographic mask.

Referring to FIG. 1, the main patterns 101 and the assisting pattern 102 are on a same surface; and the assisting pattern 102 is between the main patterns 101. When the critical dimension of the main patterns 101 continuously decreases, distances between main patterns 101 may also continuously decrease, thus there may be no room to add assisting patterns 102. Thus, a layout of the main patterns 101 and the assisting pattern 102 be challenging. A routine resolve of the patterns in a photoresist layer may also be challenging. Thus, the process window of a photolithography process may be limited. A mask with three-dimensional scattering assisting patterns functioning as a refractive index disturbance is disclosed to overcome these issues.

Figure 2:
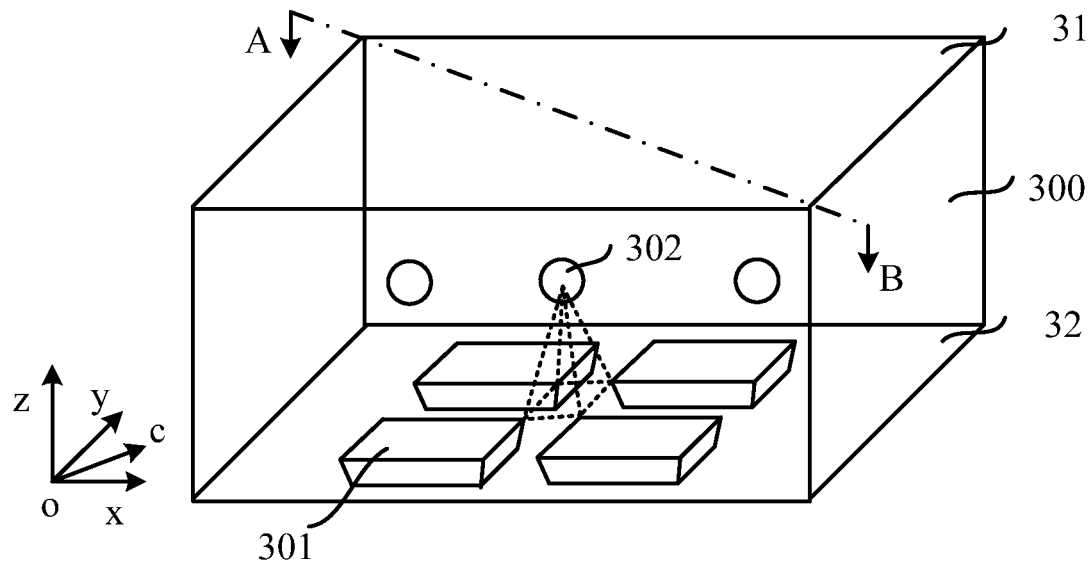
FIGS. 2~3 illustrate structures of a photolithographic mask consistent with the disclosed embodiments.
Figure 3:
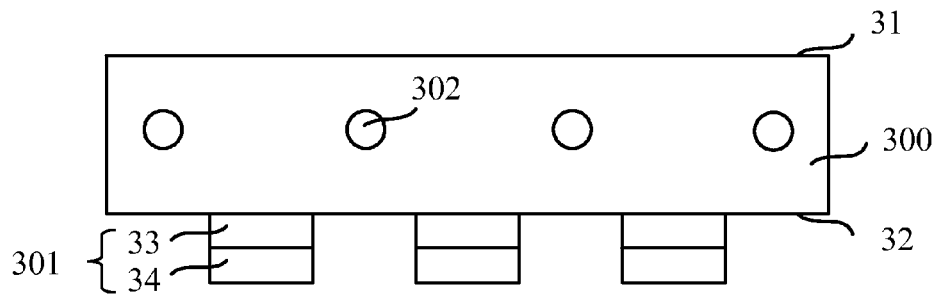

FIGS. 2~3 illustrate structures of a photolithographic mask consistent with the disclosed embodiments. FIG. 3 is a cross-section view of the photolithographic mask shown in FIG. 2 along the AB direction.

As shown in FIG. 2 and FIG. 3, the photolithographic mask includes a substrate 300. The substrate 300 has a first surface 31 and a second surface 32 corresponding to the first surface 31. The first surface 31 may be an incidence plane of an exposure light. Further, a plurality of scattering centers 302 may be formed inside the substrate 300. Further, a plurality of discrete mask patterns 301 may be formed on the second surface 32 of the substrate 300.

A three-dimensional reference system may be used to describe the detailed structures and principles of the photolithographic mask. As shown in FIG. 2, 'ox' direction and 'oy' direction may refer two plane directions which are perpendicular to etch other. 'oz' direction may refer to a vertical direction which is vertical to a plane formed by the 'ox' direction and the 'oy' direction. Referring to FIG. 2, 'oc' direction may refer to a diagonal direction of a rectangle formed by four adjacent mask patterns 301. Thus, the 'ox' direction and the 'oy direction may also be two lateral directions which corresponds to the two sides of the rectangle.

The substrate 300 may be made of any appropriate transparent material, such as quartz, fused silica or glass, etc. In one embodiment, the substrate 300 is made of quartz. The mask patterns 301 may be formed on the second surface 32 of the substrate 300; and the scattering centers 302 may be formed inside the substrate 300. The centers of four adjacent mask patterns 301 may form an imaginary rectangle, and one scattering center 302 may be formed above the center of the rectangle along the 'oz' direction.

During a photolithography process using a photographic mask without the scattering center 302, an exposure light (incidence light) may enter into the substrate 300 from the first surface 31. A portion of the incidence light may be blocked by the mask patterns 301, and the rest of the incidence light may propagate through the second surface 32. The passing incidence light further passes through the optical projection system of a mask aligner (or a stepper) to be focused on a photoresist layer on a wafer. Thus, the patterns on the mask may be transferred to the photoresist layer on the wafer.

In present disclosure, the scattering centers 302 may be formed between the first surface 31 of the substrate 300 and the mask patterns 301, thus the scattering centers 302 may be utilized to adjust a light intensity of the exposure light before passing through the mask patterns 301 (or propagating through the second surface 32 of the substrate 300). Such an adjustment may reduce the asymmetry of the light intensities along different directions, or reduce the difference of the light intensities along different directions.

For example, the light intensity along the lateral 'ox' direction may be different from the light in the 'oc' direction if there is no scattering center 302 because the light intensity of the 'oc' direction may result from an overlap of the light intensity along the lateral 'ox' direction and the light intensity of the lateral 'oy' direction. When the incident light passes through the scattering centers 302, it may be scattered and redistributed, the difference between the light intensity after the mask patterns 301 along the 'ox' direction and the light intensity after the mask patterns 301 along the 'oc' direction may be reduced. Thus, in one embodiment, when the photolithographic mask is used to form a plurality of contact holes, a dense contact hole pattern circularity may be improved.

Various factors may achieve the adjustment of the scattering centers 302 to the light intensity. One factor may be a reflection effect of the scattering assisting patterns 302. The scattering centers 302 may reflect a portion of the incidence light, thus incidence light under (or behind) the scattering centers 302 is reduced. Another factor may be a projection the scattering assisting patterns 302 on a plane of the mask patterns 301. The projection may adjust a light intensity distributed on the mask patterns 301. Such an adjustment may reduce intensity differences of the mask patterns at different regions, and improve a pattern contrast.

The scattering center 302 may be formed any appropriate position inside of the substrate 300, a refraction index of a region of the scattering centers 302 may be smaller than a refraction index of the substrate 300. Thus, when the exposure light propagates through the scattering centers 302, a diffraction effect of the scattering centers 302 to the exposure light propagating through the region of the scattering centers 302 may be relatively big; and the light intensity of the exposure light propagating through the region of the scattering centers 302 may be reduced. Thus, an effect of the scattering centers 302 may also be referred as a disturbance of the refractive index of the substrate 300.

Various structures may be used as the scattering centers 302, such as vacuum balls, or modified regions, etc. Each of the scattering centers 302 may locate in the substrate 300 above the center of a rectangle formed by four adjacent vertex angles of four row-column distributed mask patterns 301 along the 'oz' direction, thus the scattering centers 302 may be able to adjust the light intensity of the exposure light passing through the mask patterns 301, and reduce intensity differences between light along a diagonal direction (the 'oc' direction) and light along the lateral direction (the 'ox' direction and/or the 'oy' direction). Therefore, a deviation between patterns in subsequently formed in a photoresist layer on a wafer and patterns on the mask may be reduced.

A diameter of the scattering centers 302 may be in a range of approximately 50 nm~100 nm. A distance between the scattering centers 302 and the second surface 32 of the substrate 300 may be greater than approximately 100 nm. Such a diameter and distance may cause the scattering centers 302 to have relatively small effect on a total light intensity. Such a diameter and distance may also cause the size of the scattering centers 302 to be smaller than distances between the mask patterns 301 in a dense region. Further, such a diameter and distance may cause the scattering centers 203 to be unable to form an image on a focus plane. The diameter of the scattering assisting patterns 302 may be a maximum lateral size of the scattering patterns on the 'xy' plane. A focus depth of the optical system of a mask aligner (or stepper) using the photolithographic mask having the scattering centers 302 may be smaller than approximately 100 nm.

In certain other embodiments, the diameter of the scattering centers 302 may be other values. The distance between the scattering centers 302 and the second surface 32 of the substrate 300 may be other values. The focus depth of the optical system of the mask aligner (or stepper) using the mask having the scattering centers 302 may be other values.

In one embodiment, the scattering centers 302 are the modified regions of the substrate 300, a crystal structure of the modified regions may be different form a crystal structure of the substrate 300. In one embodiment, the substrate 300 is single crystalline; the modified regions are poly crystalline, or amorphous, or a mixture of poly crystalline and amorphous. The modified region may be transformed from the single crystalline structure of the substrate 300. Because the crystal structure of the modified regions may be different from the crystal structure of the substrate 300, a refractive index of the modified regions may be different from the refractive index of the substrate 300. Thus, a refractive index disturbance may be achieved.

The scattering centers 302 may also be vacuum balls in the substrate 300 to achieve a refractive index disturbance. Because the vacuum balls are vacuum, the refractive index of a vacuum ball region may be different from the refractive index of the substrate 300. The vacuum balls may be spheres, similar spheres, elliptical spheres, similar spheres, or irregular spheres, etc. The vacuum balls may also be cylinders, similar cylinders, cones, similar cones, circular cones, similar circular cones, cubes, similar cubes, or other regular or irregular structures.

The scattering centers 302 and the mask patterns 301 may have other layouts. In one embodiment, if a number of adjacent mask patterns 301 is greater than three, connecting lines of corresponding adjacent vertex angles of adjacent mask patterns 301 may form a polygon, each of the scattering centers 302 may be right above the center of the polygon in the substrate 300.

In certain other embodiments, if the second surface 32 of the substrate 300 has dense pattern regions and loose pattern regions, the scattering centers 302 may be right above a proximity region of the dense pattern regions in the substrate 300.

In certain other embodiments, any other appropriate layout may also be used for the scattering centers 302 and the mask patterns 301.

In one embodiment, the scattering centers 302 are solid structures, a local disturbance of refractive index may be achieved. The solid structures may be made of a material different from the substrate 300; and the refractive index of the solid structure may be smaller than the refractive index of the substrate 300. The solid structures may be made of any transparent, opaque, or semitransparent material, such as $MgF_2$, $TiO_2$, $ZnSe$, $ZnS$, or graphite, etc.

In certain other embodiments, the refractive index of the scattering centers 302 may be greater than the refractive index of the substrate 300.

The mask patterns 301 may be made of any appropriate material, such as one or more of MoSi, Co, Cr and Ti, etc. In one embodiment, as shown in FIG. 3, the mask patterns 301 are made of a MoSi layer 33 on the second surface of the substrate 300, and a Cr layer 32 on the MoSi layer 34.

In certain other embodiments, the mask patterns 301 may also be phase transfer mask patterns or two phase mask patterns, etc.

The scattering centers 302 of the photolithographic mask may adjust the light intensity of the exposure light passing through the mask patterns 301 through the refractive index disturbance, such an adjustment may reduce the asymmetry of the light intensity distributions along different directions, or the difference of the light intensity along different directions, thus the difference between the patterns formed in the photoresist layer on the wafer and the patterns on the photolithographic mask may be reduced. Further, because the scattering centers 302 may be formed inside of the substrate, and the mask patterns 301 are formed on the second surface 32 of the substrate 300, the scattering centers 302 and the mask patterns 301 are spatially distributed. That is, the scattering centers 302 and the mask patterns 301 are not on a same plane (may be referred as a three-dimensional distribution), thus the scattering centers 302 may not occupy space of the mask patterns 301. Therefore, distances between adjacent mask patterns 301 may be smaller, an integration level of devices may be increased, and the process window of a photolithography process may be increased simultaneously.

Figure 4:
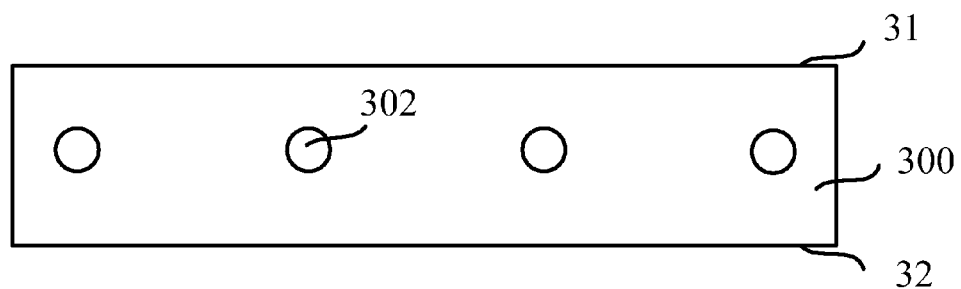
FIGS. 4~5 illustrate structures corresponding to certain stages of a fabrication process of a photolithographic mask consistent with the disclosed embodiments.
Figure 5:
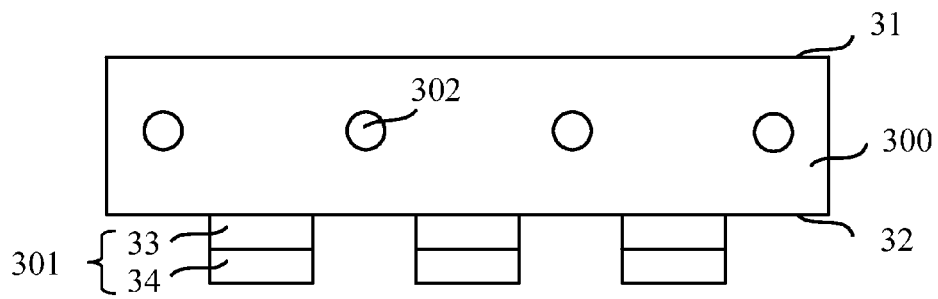

FIG. 4 and FIG. 5 illustrates structures corresponding to various stages of a fabrication process of a photolithographic mask consistent with the disclosed embodiments.

As shown in FIG. 4, at the beginning of the fabrication process, a substrate 300 is provided. The substrate 300 may have a first surface 31 and a second surface 32 corresponding to the surface 31. The first surface 31 may be an incidence plane of an exposure light.

The substrate 300 may be made of any appropriate material. In one embodiment, the substrate 300 is made of quartz.

After providing the substrate 300 having the first surface 31 and the second surface 32, a plurality of scattering centers 302 may be formed inside of the substrate 300. Various processes may be used to form the scattering centers 302. In one embodiment, if the substrate 300 is made of quartz, the scattering centers 302 may be formed by a laser melting process. A method for forming the scattering centers 302 inside the substrate 300 may include focusing a laser inside the substrate 300; and melting material at a focus point inside the substrate 300, and the scattering centers 302 are formed.

A pulse width of the laser may be in a range of approximately 1 ns~200 ns. A frequency of the laser may be in a range of approximately 80 kHz~200 KHz. A power of the laser at a focus point may be greater than approximately $1E18$ $W/cm^2$.

In one embodiment, the scattering centers 302 are vacuum balls, a laser may be focused inside the substrate 300, and an optical damage phenomenon may be induced by multi phonon absorptions. Thus, thermal deformations may be generated inside the substrate 300, and the vacuum balls may be formed.

In one embodiment, the scattering centers 302 are modified regions. The laser may be focused on a region inside the substrate 300. The region may be locally heated by multiple photon absorptions. The regions may be melted; and then resolidified to form the modified regions. A crystal structure of the modified regions may be different from a crystal structure of the substrate 300. For example, the crystal structure of the substrate 300 may be single crystalline, while the crystal structure of the modified regions may be poly crystalline, amorphous or a mixture of poly crystalline and amorphous after the melting and resolidifying processes.

A diffraction index of the region of the scattering centers 302 may be smaller than a diffraction index of the substrate 300. A diameter of the vacuum spheres may be in a range of approximately 50 nm~100 nm. A distance between the scattering centers 302 and the substrate 300 may be greater than approximately 100 nm.

Further, after forming the scattering centers 302 inside the substrate 300, a plurality of mask patterns 301 may be formed on the second surface 32 of the substrate 300. The mask patterns 301 may be made of any appropriate material. In one embodiment, the mask patterns 301 are opaque MoSi mask patterns. The MoSi mask patterns may include a MoSi layer 33 on the second surface 32 of the substrate 300 and a Cr metal layer 34 on the MoSi layer 33.

Various processes may be used to form the MoSi layer 33 and the Cr metal layer 34, such as chemical vapor deposition (CVD) process, a physical vapor deposition (PVD) process, an electroplating process, or a sputtering process, etc.

Various processes may be used to form the mask patterns 301, such as a laser writing process, or an electrode beam lithography process, etc.

Figure 6:
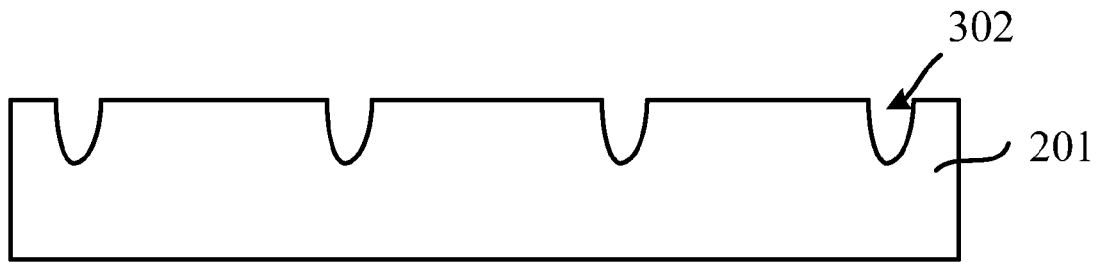
FIGS. 6~8 illustrate structures corresponding to certain stages of another fabrication process of a photolithographic mask consistent with the disclosed embodiments.
Figure 7:
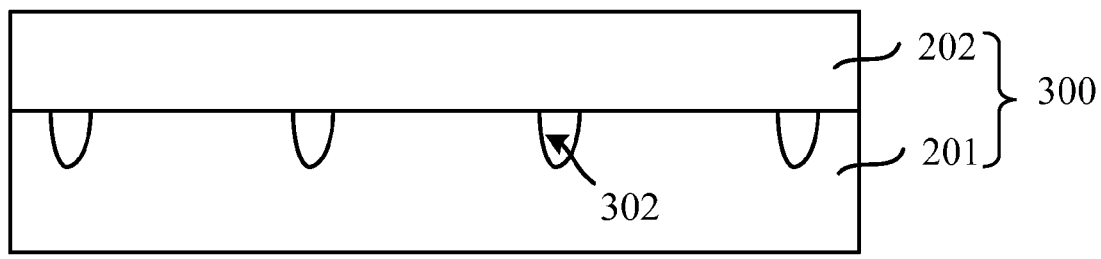
Figure 8:
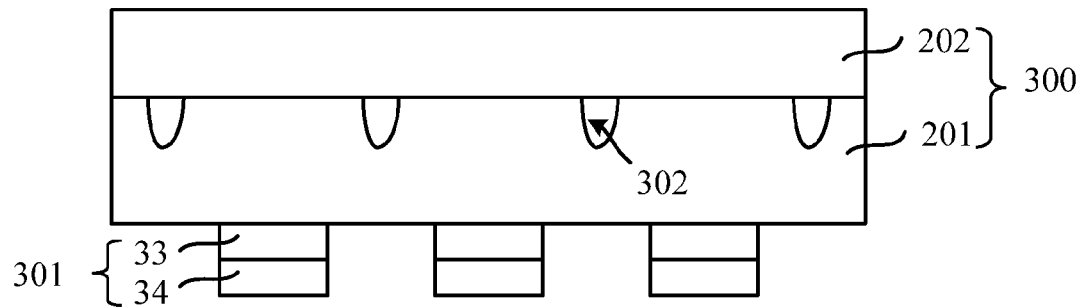

FIGS. 6~8 illustrate structures corresponding to various stages of another fabrication process of a photolithographic mask consistent with the disclosed embodiments.

As shown in FIG. 6, at the beginning of the fabrication process, a substrate 201 is provided. The substrate 201 may be made of any appropriate material. In one embodiment, the substrate 201 is made of quartz.

After providing the substrate 201, a plurality of first voids 302 may be formed in one surface of the substrate 201. Sidewalls and bottoms of the first voids 302 may have certain radians. The first voids 302 may be subsequently used as scattering centers, a refraction effect of the sidewalls and the bottoms of the first voids 302 to a vertical incidence light may be relatively strong.

The first voids 302 may be formed by etching the substrate 201. Various processes may be used to etch the substrate 201, such as a dry etching process, or a wet etching process, etc. The first voids 302 may also be formed by a laser melting process, a focused ion beam milling process, or a mechanical grinding process, etc.

Before forming the first voids 302, a mask layer having certain openings may be formed on the substrate 201. Positions of the openings may correspond to positions of the first voids 302 formed in the surface of the substrate 201.

Optionally and additionally, after forming the first voids 302, a scattering material (entity structure material) may be filled in the first voids 302. A refractive index of the scattering material may smaller, or greater than a refractive index of the substrate 201. By using the scattering material, a refractive index difference between the scattering patterns and the substrate 202 may be achieved.

In one embodiment, the refractive index of the scattering material is smaller than the refractive index of the substrate 201. The scattering material may be transparent, opaque, or semitransparent, etc.

The scattering material may be made of any appropriate material, such as $MgF_2$, $TiO_2$, ZnSe, ZnS, or graphite, etc.

Further, as shown in FIG. 7, a second substrate 202 is provided; and the second substrate 202 and the first substrate 201 may be bonded together. The first substrate 201 and the second substrate 202 may be bonded in a vacuum environment. The second substrate 202 may seal all of the first voids 302. The sealed first voids 302 may form scattering centers; and the first substrate 201 and the second substrate 202 may form a substrate 300.

The second substrate 202 may be made of any appropriate material, such as quartz, fused silica or glass, etc. In one embodiment, the second substrate 202 is made of quartz.

In the vacuum environment, the second substrate 202 and the first substrate 201 may be bonded together to cause the sealed first voids 302 to be vacuum as well, thus a refractive index of the sealed first voids 302 may be smaller than a refractive index of the first substrate 201 and the second substrate 202.

Various processes may be used to bond the first substrate 201 and the second substrate 202, such as a direct wafer bonding process, a melting silicon wafer bonding process, an anodic wafer bonding process or a metal diffusion wafer bonding process, etc. In one embodiment, a direct wafer bonding process or a melting silicon wafer bonding process is used to bond the first substrate 201 and the second substrate 202 together to form the substrate 300.

In certain other embodiments, a plurality of second voids (not shown) may be formed in the second substrate 202; and a shape of the second voids may be identical to a shape of the first voids 302 in the first substrate 201. Further, positions of the second voids may correspond to positions of the first voids 302 in the first substrate 201. After the second substrate 202 and the first substrate 201 are bonded together, each of the second voids in the second substrate 202 and a corresponding first void 302 may form a void to be used as a scattering center.

In certain other embodiments, a plurality of second voids may be formed in the second substrate 202, a shape of the second voids may be identical to a shape of the first voids 302 in the first substrate 201; and positions of the second voids may correspond to positions of the first voids 302 in the first substrate 201. Then, the second voids may also be filled with a scattering material. After the first substrate 201 and the second substrate 202 are bonded together, the scattering material in the first voids and the scattering material in the second voids may together form the scattering centers.

In one embodiment, the scattering material filled in the first voids 302 may be same as the scattering material filled in the second voids. In certain other embodiments, the scattering material filled in the first voids 302 may be different from the scattering material filled in the second voids.

Further, as shown in FIG. 8, after the first substrate 201 and the second substrate 202 are bonded together, a plurality of the mask patterns 301 may be formed on the first substrate 201.

The mask patterns 301 may be made of any appropriate material. In one embodiment, the mask patterns 301 are opaque MoSi mask patterns. The MoSi mask patterns may include a MoSi layer 33 on the second surface 32 of the substrate 300 and a Cr metal layer 34 on the MoSi layer 33.

Various processes may be used to form the MoSi layer 33 and the Cr metal layer 34, such as a chemical vapor deposition (CVD) process, a physical vapor deposition (PVD) process, an electroplating process, or a sputtering process, etc.

Various processes may be used to form the mask patterns 301, such as a laser writing process, or an electrode beam lithography process, etc.

Thus, a mask with 3-D scattering bars formed by the scattering centers 302 may be formed. The scattering centers 302 may have a refractive index disturbance effect to adjust light intensity.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A photolithographic mask, comprising:
   a first substrate including a first plurality of scattering centers therein, wherein the first plurality of scattering centers are exposed at a top surface of the first substrate;
   a plurality of mask patterns on a bottom surface of the first substrate; and
   a second substrate bonded on the top surface of the first substrate to cover the first plurality of scattering centers, wherein:
   the second substrate has a top surface configured as a light incidence surface in a photolithographic exposure process, and
   the first plurality of scattering centers are functioned as a refractive index disturbance in the bonded substrate.

2. The photolithographic mask according claim 1, wherein:
   a refractive index of the first plurality of scattering centers is smaller than a refractive index of each of the first and second substrates.

3. The photolithographic mask according to claim 1, wherein:
   the first plurality of scattering centers are vacuum spheres or modified regions in the first substrate.

4. The photolithographic mask according to claim 3, wherein:
   a diameter of the first plurality of scattering centers is in a range of approximately 50 nm-100 nm.

5. The photolithographic mask according to claim 3, wherein:
   a crystal structure of the modified regions are different from a crystal structure of the first substrate, wherein:
   the crystal structure of the first substrate is single crystalline; and
   the crystal structure of the modified regions is poly crystalline, amorphous, or a combination of poly crystalline and amorphous.

6. The photolithographic mask according to claim 1, wherein:
   the first plurality of scattering centers are entity structures formed by filling a material in voids in the first substrate; and
   the material of the entity structures is different from a material of the first substrate.

7. The photolithographic mask according to claim 6, wherein:
   the material of the entity structures includes $MgF_2$, $TiO_2$, ZnSe, ZnS, or graphite.

8. The photolithographic mask according to claim 1, wherein:
   a distance between the adjacent scattering centers is equal to, or greater than approximately 100 nm.

9. The photolithographic mask according to claim 1, wherein:
   connecting lines of a plurality adjacent vertex angles corresponding to a plurality of adjacent mask patterns form an imaginary polygon on the bottom surface of the second substrate; and
   each of the first plurality of scattering centers is above a center of the imaginary polygon.

10. The photolithographic mask according to claim 1, wherein:
    the mask patterns are phase shifting mask patterns, opaque MoSi mask patterns or two phases mask patterns.

11. The photolithographic mask according to claim 1, wherein:
    each of the first and second substrates is made of quartz.

12. The photolithographic mask according to claim 1, wherein:
    the second substrate further includes a second plurality of scattering centers therein,
    the second plurality of scattering centers are exposed at the bottom surface of the second substrate and positioned in line with the first plurality of scattering centers in the first substrate, and
    the first and second pluralities of scattering centers together are functioned as a refractive index disturbance in the bonded substrate.

13. The photolithographic mask according to claim 12, wherein:
    the first and second pluralities of scattering centers are the same.

14. A method for fabricating a photolithographic mask, comprising:
    providing a first substrate;
    forming a first plurality of scattering centers in the first substrate, wherein the first plurality of scattering centers are exposed at a top surface of the first substrate;

bonding a second substrate on the top surface of the first substrate to cover the first plurality of scattering centers, wherein:

the second substrate has a top surface configured as a light incidence surface in a photolithographic exposure process, and the first plurality of scattering centers are functioned as a refractive index disturbance in the bonded substrate; and forming a plurality of mask patterns on a bottom surface of the first substrate.

15. The method according to claim 14, wherein forming the first plurality of scattering centers includes:

forming a plurality of voids in the first substrate by an etching process.

16. The method according to claim 14, wherein:
the first plurality of scattering centers are vacuum spheres.

17. The method according to claim 14, wherein:
a refractive index of the first plurality of scattering centers is smaller than a refractive index of each of the first and second substrates.

18. The method according to claim 14, wherein the bonding step includes:

bonding the first substrate with the second substrate in a vacuum environment to cause the second substrate to seal the first plurality of scattering centers in the first substrate.

19. The method according to claim 14, wherein the step of forming the first plurality of scattering centers in the first substrate includes:

forming a plurality of first voids in the first substrate; and filling the first voids with a scattering material.

20. The method according to claim 14, wherein:

the second substrate further includes a second plurality of scattering centers therein, the second plurality of scattering centers are exposed at the bottom surface of the second substrate and positioned in line with the first plurality of scattering centers in the first substrate, and the first and second pluralities of scattering centers together are functioned as a refractive index disturbance in the bonded substrate.

\* \* \* \* \*